(12) United States Patent
Garner

(10) Patent No.: US 8,415,101 B2
(45) Date of Patent: *Apr. 9, 2013

(54) DIGITAL OPTICAL CHEMISTRY MICROMIRROR IMAGER

(75) Inventor: Harold R. Garner, Flower Mound, TX (US)

(73) Assignee: Roche Nimblegen, Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/246,950

(22) Filed: Sep. 28, 2011

(65) Prior Publication Data

US 2012/0015305 A1 Jan. 19, 2012

Related U.S. Application Data

(63) Continuation of application No. 12/870,187, filed on Aug. 27, 2010, now Pat. No. 8,030,056, which is a continuation of application No. 11/704,536, filed on Feb. 9, 2007, now Pat. No. 7,785,863, which is a continuation of application No. 09/998,341, filed on Nov. 29, 2001, now abandoned, which is a continuation of application No. 09/776,202, filed on Feb. 2, 2001, now abandoned, which is a continuation of application No. 09/326,526, filed on Jun. 4, 1999, now Pat. No. 6,295, 153.

(60) Provisional application No. 60/087,948, filed on Jun. 4, 1998.

(51) Int. Cl.
*C12Q 1/68* (2006.01)
*G01N 15/06* (2006.01)
*C07H 21/00* (2006.01)
*C12N 15/63* (2006.01)

(52) U.S. Cl. .................. 435/6.1; 435/283.1; 435/287.2; 435/292.1; 536/25.3; 530/333

(58) Field of Classification Search .................. None
See application file for complete search history.

(56) References Cited

U.S. PATENT DOCUMENTS 5,474,796 A 12/1995 Brennan
5,504,614 A 4/1996 Webb
(Continued)

FOREIGN PATENT DOCUMENTS

WO 9941007 A2 8/1999

OTHER PUBLICATIONS

Hornbeck, L., "Digital Light Processing for High-Brightness, High Resolution Applications," Proc. SPIE, vol. 3013, p. 1-14. 1995.

(Continued)

*Primary Examiner* — Betty Forman
(74) *Attorney, Agent, or Firm* — Quarles & Brady LLP

(57) ABSTRACT

An apparatus and method for catalyzing a reaction on a substrate (24) comprising, a light source (12), a micromirror (16) positioned to redirect light (14) from the light source (12) toward a substrate (24) wherein the redirected light (14) catalyzes a chemical reaction proximate a substrate (24), is disclosed. A computer (18) is connected to, and controls, the positioning of mirrors within the micromirror (16) to specifically redirect light to specific portions of a substrate. The substrate (24) can be placed in a reaction chamber (50), wherein the light (14) that is redirected by the micromirror (16) catalyzes a chemical reaction proximate a substrate (24).

20 Claims, 3 Drawing Sheets

U.S. PATENT DOCUMENTS

| | | | |
|---|---|---|---|
| 5,870,176 | A | 2/1999 | Sweatt et al. |
| 5,959,098 | A | 9/1999 | Goldberg et al. |
| 6,295,153 | B1 * | 9/2001 | Garner ............... 359/212.1 |
| 6,375,903 | B1 * | 4/2002 | Cerrina et al. ........... 422/131 |
| 6,379,895 | B1 | 4/2002 | Fodor et al. |
| 6,426,184 | B1 | 7/2002 | Gao et al. |
| 6,480,324 | B2 | 11/2002 | Quate et al. |
| 6,657,758 | B1 | 12/2003 | Garner |
| 7,785,863 | B2 * | 8/2010 | Garner ............... 435/283.1 |
| 8,030,056 | B2 | 10/2011 | Garner |

OTHER PUBLICATIONS

Sundberg, S.A. et al, "Spatially-Addressable Immobilization of Macromolecules on Solid Supports," J. Am. Chem. Soc., 1995, pp. 12050-12057.

Feldman, W. and P. Pevzner, "Gray Code Masks for Sequencing by Hybridization," Genomics, May 1994, pp. 233-235.

Groves, J.T. et al, "Micropatterning Fluid Lipid Bilayers on Solid-Supports," Science, Jan. 31, 1997, vol. 275, pp. 651-653.

Strachan, T. et al, "A New Dimension for the Human Genome Project: Towards Comprehensive Expression Maps," Nature Genetics, vol. 16, Jun. 16, 1997, pp. 126-132.

Kim, E. et al, "Polymer Microstructures Formed by Moulding in Capillaries," Nature, Aug. 17, 1995, vol. 376, pp. 581-584.

Park, M., et al, "Block Copolymer Lithography: Periodic Arrays of 1011 Holes in 1 Square Centimeter," Science, May 30, 1997, vol. 276, pp. 1401-1404.

Chrisey, L.A. et al, "Fabrication of Patterned DNA Surfaces," Nucleic Acids Research, May 1996, vol. 24, No. 15, pp. 3040-3047.

O'Brien, K. et al, "Astral, a Hyperspectral Imaging DNA Sequencer," Review of Scientific Instruments, vol. 69, No. 5, May. 1998, pp. 1-6.

Hacia, J.G. Etal, "To Affinity . . . and Beyond,!" Editorial, Nature Genetics Dec. 1996, vol. 14, No. 4, pp. 367-370.

Garner, H., "Automating the Genome Center," IEEE Engineering in Medicine and Biology, Apr./May 1994, pp. 281-283.

McGall, G. H. et al, "The Efficiency of Light-Directed Synthesis of DNA Arrays on Glass Substrates," American Chemical Society, Jun. 4, 1997, pp. 5081-5090.

McGall, H. et al, "The Efficiency of Light-Directed Synthesis of DNA Arrays on Glass Substrates," J. Am. Chem. Soc., Dec. 17, 1996, 20 pages.

Caviani-Pease, A. et al, "Light-Generated Oligonucleotide Arrays for Rapid DNA Sequence Analysis," Proc. Natl. Acad. Sci. USA, May 1994, vol. 91, pp. 5022-5026.

McGall, G. et al, "Light-Directed Synthesis of High-Density Oligonucleotide Arrays Using Semiconductor Photoresists," Proc. Natl. Acad. Scie. USA, vol. 93, Nov. 1996, pp. 13555-13560.

"Optical Equipment Imaging Systems," R&D 100 Awards, Sep. 2000, Write in 2014, p. 141.

* cited by examiner

DIGITAL OPTICAL CHEMISTRY MICROMIRROR IMAGER

CROSS-REFERENCE TO RELATED APPLICATIONS

This application is a continuation of U.S. application Ser. No. 12/870,187, filed Aug. 27, 2010 now U.S. Pat. No. 8,030,056, which is a continuation of U.S. application Ser. No. 11/704,536, filed Feb. 9, 2007 (now U.S. Pat. No. 7,785,863, issued Aug. 31, 2010), which is a continuation of U.S. application Ser. No. 09/998,341, filed Nov. 29, 2001 (abandoned), which is a continuation of U.S. application Ser. No. 09/776,202, filed Feb. 2, 2001 (abandoned), which is a continuation of U.S. application Ser. No. 09/326,526 filed Jun. 4, 1999 (U.S. Pat. No. 6,295,153, issued Sep. 25, 2001). This application claims priority under 35 U.S.C. §119(e)(1) of provisional patent application No. 60/087,948, filed Jun. 4, 1998.

TECHNICAL FIELD OF THE INVENTION

The present invention relates in general to the field of optical chemistry, and more particularly, to an apparatus and method for conducting a light directed chemical synthesis or reaction on a substrate using a computer controlled digital light processing micromirror array.

BACKGROUND OF THE INVENTION

Without limiting the scope of the invention, its background is described in connection with the patterning of a photolithographic emulsion for the fabrication of electronic devices for use in large scale integration, as an example.

Heretofore, in this field, photolithographic patterning of integrated circuits has depended on the formation and images with visible or ultraviolet light in a photoresist. To achieve large scale integration of electronic circuit devices, photoresist is patterned is currently achieved using proximity or projection printing. Proximity or projection printing of photolithographic patterns on substrates such as single grain silicon, depend on the printing of a lithographic mask on, e.g., fused-silica.

One problem with photolithographic masks is the degradation of the mask with each exposure to high intensity light or other rays. For example, a fused-silica mask that is used to pattern a large, dense semiconductor chip can have a useful life as low as two hours. Furthermore, the formation of masks requires a separate process, akin to wafer fabrication, in which the masks are patterned on a ultraviolet transparent material, usually having a metallic overcoat into which the pattern is etched. The entire mask producing process is akin to wafer fabrication in that similar care must be taken to prevent contamination with particulate matter from processing reagents and the atmosphere in which the masks are created and handled. The mask process is also very costly, cost which is further accentuated by the difficulty in making reliable, long lasting masks. Also, the turnaround time for mask making makes rapid changes to designs somewhat prohibitive.

A number of problems are encountered using masks for a wide variety of applications. For example, U.S. Pat. No. 5,626,784, issued to Simons, discloses a method for improving the alignment of photolithographic masks using a frame having sides that are individually thermally expandable. The mask is fabricated to be undersized so that the distance between fiducials on the mask is less than a desired distance, which may be the distance between corresponding fiducials on the workpiece. The mask is mounted on the frame, and at least one side of the frame is heated to expand the side and stretch the mask to achieve the desired interfiducial distance. While alignment of a mask is improved using the method disclosed, masks for each of the steps requiring photoresist are still required. Also, with each step requiring a mask, the above method has to be repeated to accomplish the underlying photoresist patterning

SUMMARY OF THE INVENTION

It has been found that present apparatus and methods fail to meet the demands for a low cost, efficient, customizable method of small scale patterning for use in the creation of arrays for read-out systems that are capable of overlapping, concurrent data acquisition and analysis. Present patterning techniques also require the creation of masks for each step that involves the patterning of a photoresist during the formation of integrated circuits.

In the area of semiconductor design and manufacturing, a significant problem of current systems is that during the formation of semiconductor chips a number of photolithographic masks must be custom designed and printed for steps that require photolithographic protection of portions of a substrate. Each steps that requires photolithographic masks to, e.g., protect portions of semiconductor layers during etching or blanket deposition of semiconductor device layers, must be fit with a unique mask. Furthermore, each mask must be closely aligned to achieve efficient formation of major semiconductor components. The cost of implementation of novel designs for semiconductor devices is greatly increased by the need to design, print and pattern each mask separately. What is needed to design, test and implement integrated circuit design changes, therefore, is a rapid, inexpensive apparatus and method for patterning a photoresist on a semiconductor substrate that uses existing technology.

Current biochip technology is based on principles not unlike the formation of integrated circuit devices on a semiconductor substrate or template. It is recognized, as disclosed herein, that current biochip fabrication technology is afflicted by the same inefficiencies intrinsic to the use of photolithography to pattern and protect light catalyzed chemical reactions on active and inactive substrates. The present invention is based on the recognition that photolithographic masks are incapable of being designed, printed and used, at a reasonable cost to achieve the needed diversity for arrays of, e.g., oligonucleotide, polypeptide arrays or small chemical molecules. During large scale resequencing, for example, the ability to create a system for determining nucleotide sequences having a large diversity based on data previously obtained from an automated sequencer.

More particularly, the present invention can be an apparatus for catalyzing a reaction on a substrate comprising a light source that is directed toward a micromirror positioned to redirect light from the light source toward a substrate. A computer is connected to, and controls, the micromirror and a substrate holder, such as a reaction chamber, that is placed in the path of light redirected by the micromirror, wherein light that is redirected by the micromirror catalyzes a chemical reaction proximate the substrate. By proximate it is meant that the light catalyzed reaction can occur on or about the surface of the substrate. A light source for use with the present invention is a lamp or laser, such as a UV light. In an alternative embodiment the light source can be, e.g., a xenon lamp, or a mercury lamp, or a laser or a combination thereof. The light produced by the light source can also be visible light. One advantage of catalyzing chemical reactions using UV light is that it provides photons having the required high energy for the reaction. UV light is also advantageous due to its wavelength providing high resolution. Lenses can be positioned between the light source and the micromirror, which can be a micromirror array, or between the micromirror and the substrate. An example of such a lens is a diffusion lens.

Light from the light source can interact with, e.g., a novolak resin proximate to the substrate to produce a negative or a positive pattern in photoresist. The light catalyzed synthesis or reaction can be, e.g., the addition a nucleotide base to the substrate or to a base or polynucleotide chain attached to the substrate. Likewise, the light redirected by the micromirror can catalyze a chemical reaction, e.g., an amino acid addition reaction or the addition, removal or crosslinking of organic or inorganic molecules or compounds, small or large. For example, during the addition of a nucleic or an amino acid residue, the light can deprotect protecting groups of, e.g., phosphoamidite containing compounds. Light can also be responsible for the crosslinking or mono-, bi-, or multi-functional binding groups or compounds to attach molecules such as, fluorochromes, antibodies, carbohydrates, lectins, lipids, and the like, to the substrate surface or to molecules previously or concurrently attached to the substrate.

The present invention can also be a method of patterning on a substrate comprising the steps of, generating a light beam, illuminating a micromirror with the light beam, redirecting the light beam with the micromirror onto a substrate and catalyzing a light sensitive reaction proximate to the surface of the substrate using the redirected light beam in a predetermined pattern. By using the method of the present invention as a series of cycles, a number of layers can be built on the substrate or strings of molecules can be built having a large diversity. The method of the present invention can further comprising the step of controlling, using a computer, the micromirror, which can be a light mirror array such as, e.g., a Texas Instruments Digital Light Processor. The illuminating light beam can be a UV, or other light source that is capable of catalyzing a chemical reaction, such as the formation of a positive or negative photoresist. The present method can also be used for the in situ addition or removal of organic or inorganic molecules or compounds, as will be known to those of skill in the art of photochemistry.

The method of the present invention can further comprise the step of, obtaining a substrate, and depositing a novolak resin on the substrate prior to redirecting the light beam to the photoresist. The method may also comprise the steps of positioning a substrate with a reaction chamber, flooding the surface of the substrate with a light catalyzable reaction chemical, such as a nucleotide or amino acid residue, and exposing the chemicals reagents light. A light catalyzable reaction chemical is activated and a reaction synthesis or decomposition is caused by light at the location where the micromirror redirects light on the substrate, but not where the micromirror does not redirect light. The present invention can be used, e.g., in "stepper" fashion, wherein the micromirror is directed at a portion of the substrate, that portion of the substrate exposed to light from the micromirror, and then stepped on to a different portion. The new portion of the substrate exposed can be, e.g., overlapping or adjacent to the first portion.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Digital Optical Chemistry System

The present invention uses Digital Light Processing technology (Texas Instruments, U.S.A.) with optical deprotection photochemistry (e.g., Affymetrix, U.S.A.), to create an apparatus and method for generating Digital Optical Chemistry (DOC) high diversity arrays. The present invention overcomes the limitations of the traditional mask-based photolithographic processes by eliminating the need for a mask. The present invention is also based on the recognition that DLP systems can be used to pattern photoresist for the fabrication of substrates, e.g., semiconductor substrates. The present invention thus overcomes the problem of manufacturing and printing photolithograhic masks for conventional photoresist patterning. The present invention can be made as a portable platform for the construction of unique high-density arrays.

Figure 1:
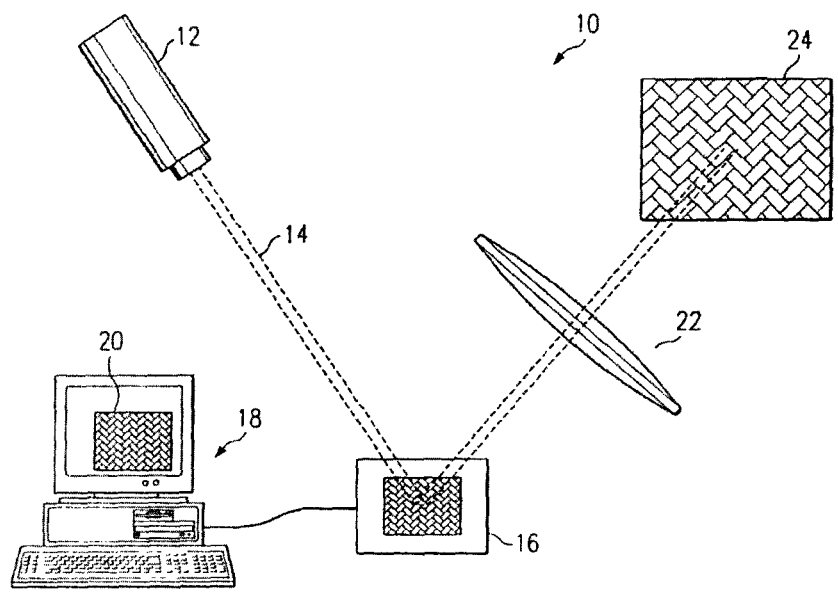
FIG. 1 is a diagram of the basic physical components of a micromirror imager.

FIG. 1 shows a depiction of a basic micromirror imager 10. The micromirror imager 10 has a light source 12 which produces light 14, which can be a light beam. The light 14 can be, e.g., a Xenon lamp, a mercury lamp, a UV light source or other light sources for use with light catalyzed chemical reactions. The choice of light source will depend on the exact photochemistry required or chosen, as will be known to those of skill in the art of photochemistry. The light 14 is redirected or deflected by a micromirror 16, such as a Digital Light Processor (DLP) micromirror array (Texas Instruments, U.S.A.). Other light deflection systems may be used with the present invention, including an individual mirror, or other light deflection system. A computer 18 is depicted controlling the positioning of individual mirrors of the micromirror 16 based on a pattern 20. The micromirror 16 deflects the light 14 into a lens 22 that can focus or diffuse the light 14 to illuminate a substrate 24. Lens 22 can be magnifying or demagnifying, to set the size of the features on the substrate 24. The apparatus may also contain a shutter (not depicted) positioned between the light source 12 and the micromirror 16 in order to increase the accuity of light 14 delivery to the micromirror 16. The shutter may also help increase the life-time of the micromirror 16 by decreasing the extent of direct and incident light that strikes the array of mirrors. Substrates 24 that can be used with the present invention include, e.g., silicon, gallium arsenide, silicon on insulator (SO) structures, epitaxial formations, germanium, germanium silicon, polysilicon, amorphous silicon, glass, quartz, or gel matrices and/or like substrates, nonconductive, semi-conductive or conductive.

Figure 2:
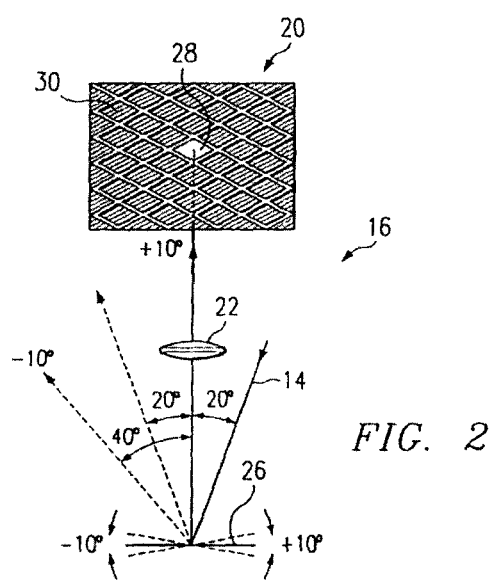
FIG. 2 is a diagram of the basic principles underlying a micromirror.

FIG. 2 shows a diagram illustrating the basic principles underlying a micromirror 16. Light 14 strikes a pixel mirror 26, which rotates around a central axis having a plus or minus ten degree rotation. The incident angle of deflection of the mirror, which for an aluminum DLP-type mirror, is 20 degrees. At plus 10 degrees light is reflected by the pixel mirror 26 into lens 22 and onto the substrate to form a light spot 28 of pattern 20. At any other angle the light is not deflected into the lens and therefore appears as a dark spot 30. Gray scale, which can be used with the present invention in some circumstances, is achieved by fluttering the pixel mirror 26 to produce the analog equivalent of a gray scale image on pattern 20.

Figure 3:
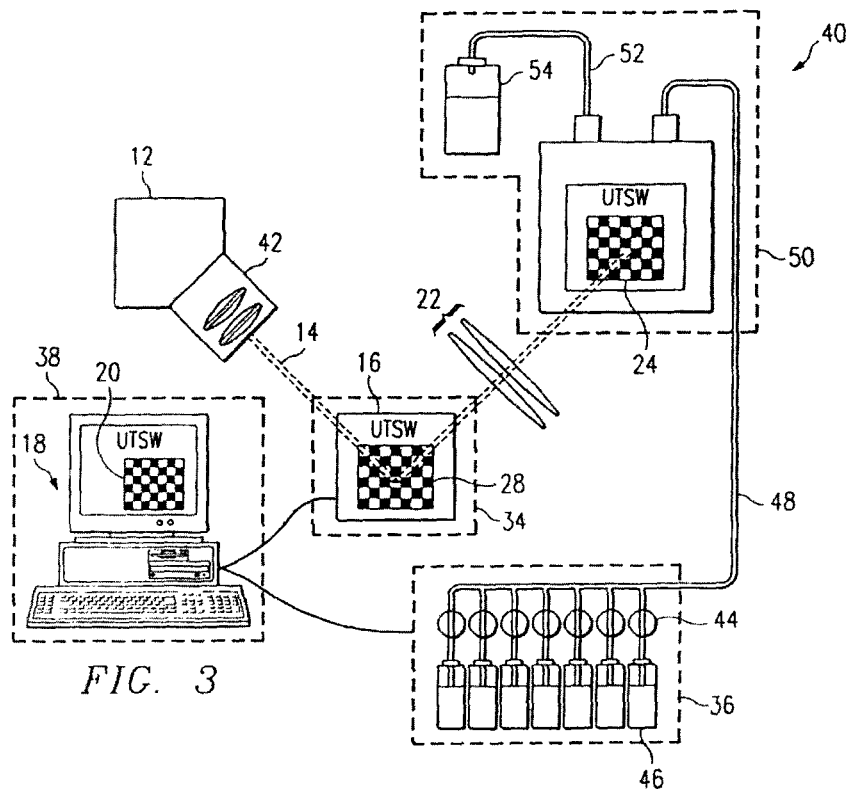
FIG. 3 is a diagram that represents a micromirror imager system.

FIG. 3 shows a diagram representing a micromirror imager system 40. The micromirror imager or DOC system of the present invention comprises generally three parts, a DLP micromirror system 34 that selectively directs light 14 onto a substrate 24 on which the reactions are conducted, a fluidics system 36 that delivers the photoactivatable reagents in proper sequence and a computer system 38 with software that controls the DLP micromirror system 34 according to the desired pattern 20. The micromirror imager system 40 can be used to create individual spots, 20 microns or smaller in size, on a substrate 24 such as glass, with up to 2 million spots per substrate using the present invention.

The present invention can also be applied to combinatorial chemistry problems and the manufacture of custom microelectronics. An important finding of the present invention was the recognition that the DLP system could be used to reflect light in the UV range. Light processing systems, such as the DLP created by Texas Instruments, was intended to be the next generation of high resolution, very bright, color true TV sets, computer monitors/projectors and movie projectors. The DLP is designed to reflect light in the visible range with a high brightness and brightness efficiency, goals that are presently unattainable by conventional liquid crystal display units. More information on the system is available at "www.ti.com/dlp/", relevant portions of which are incorporated herein by reference.

The micromirror imager system 40 is designed as a simple device on which to do synthesis (oligo or combinatorial chemistry) using, e.g., optical deprotection. As with the basic system depicted in FIG. 1, the illumination of a given area of an substrate 24 is controlled by a Digital Light Processor (DLP) micromirror 16. The pattern 20 is controllable by controlling the mirror angle using an image on a VGA monitor that is sent by the computer 18 through the DLP system. For example, one mirror can be used for each pixel on the 640×480 screen. The mirrors of the micromirror 16 are each individually controlled, with the ability to rock its angle on a 2 ms time scale. Grey scales are created by rapidly moving a mirror to project and then not project on a given position.

The substrate 24 is mounted in a custom reaction chamber 50 into which chemicals are pumped. The chemicals, including all the standard chemicals for oligonucleotide synthesis, for example, can be kept in syringes and pumped manually to the reaction chamber 50 through a chemical line 48. Alternatively an automated fluidics system 36, as depicted in FIG. 3 can be used to control the input and output of reagents into and out of reaction chamber 50. In this example, the substrate 24 is illuminated from above with light passing through the substrate 24. If the substrate 24 is not light opaque the synthesis can take place on either side of the substrate. As will be apparent to those of skill in the art of optics, light can be reflected from a substrate 24 that is not light opaque, wherein the light catalyzable reaction occurs at the site of reflection or absorption. The reaction chamber 50 can be moved to make multiple arrays at different positions on the substrate 24.

The fluidics system 36 of the present invention can include a number of reagent bottles containing synthesis chemicals 46. The synthesis chemicals 46 can be, e.g., placed under pressure under a non-reactive atmosphere, e.g., Argon or Helium, to provide pressure for chemical delivery and to reduce premature oxidation of the synthesis chemicals 46. Valves 44, under the control of a computer such as computer 18 can be used to control the timing of the synthesis chemical or chemicals 46 delivered through chemical line 48 to the reaction chamber 50.

Figure 4:
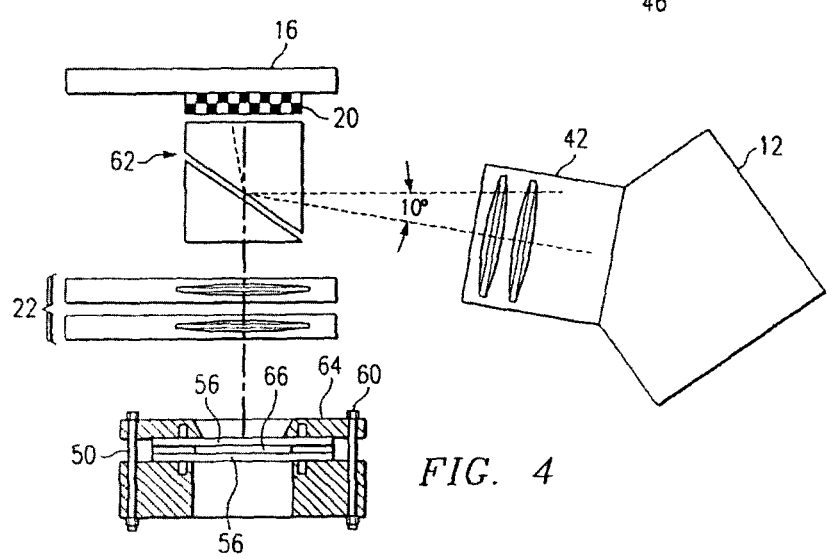
FIG. 4 is a diagram of an alternative lens mirror configuration for focusing the light using the micromirror array.

FIG. 4 is a diagram of an alternative lens mirror configuration for focusing the light using the micromirror 16. A light source 12 is positioned to illuminate a prism set 62. Light from the light source is focused onto the prism set, which in this example is a total internal reflection (TIR) mirror that deflects the light from the mirror surface into the pattern 20 that has been delivered to the micromirror 16. Light reflected by the individual mirrors then traverses the prism set into lenses 22, which can be diffusion lenses. The patterned light strikes a reaction chamber, depicted in this figure as a slide holder 60. Two slides 56 are positioned within the slide holder 60. As can be seen from this cross-sectional view of the slide holder 60, a light translucent cover 64 is disposed over the reaction chamber 50. Synthesis chemicals can be pumped into, and evacuated from the reaction chamber 50 through chemical inlets/outlets (not depicted) positioned to be in fluid communication with the interior 66 of the reaction chamber 50. As viewed from the cross-sectional view it is apparent to those of skill in the art, in light of the present disclosure, that reaction chemicals can be delivered to the interior 66 of the reaction chamber 50 from different positions, such as the sides, top or bottom of the reaction chamber 50.

Figure 5:
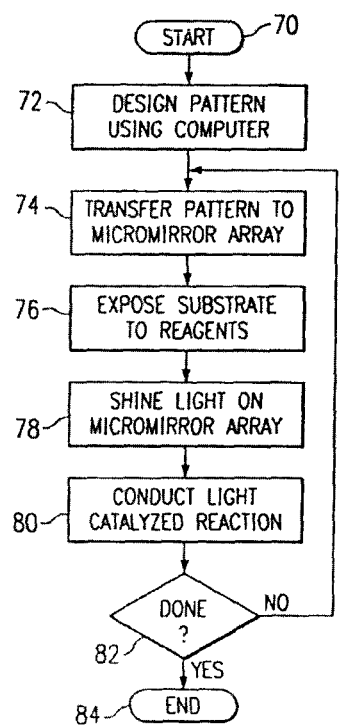
FIG. 5 is a flowchart of the steps involved in the use of a micromirror array to conduct an in situ light catalyzed reaction.

FIG. 5 is a flow chart of the steps involved in the use of a micromirror array to conduct an in situ light catalyzed reaction. In step 72 a pattern design in created using a computer. The design can be, e.g., a photolithographic pattern to be formed on a photoresist for a semiconductor integrated circuit. Alternatively, the pattern can reflect the sequence of poly-nucleotides or peptides that are to be conjugated in that particular step. One advantage of the present system is that patterns of photoresist may be deposited and/or developed in sequence at the same time that chemical reactions are being catalyzed. Alternatively, the pattern/catalysis reactions may occur in a pre-determined set of cycles that take advantage of photoresist layering and the light sensitivity of chemical reactions.

The pattern is transferred to the micromirror 16 in step 74. The substrate is then exposed to reaction reagents or chemicals, e.g., by flooding a reaction chamber 50. In step 78, the micromirror 16 is used to reflect light in the previously transferred pattern to the substrate, wherein a light catalyzed reaction takes place at the site or sites where light strikes the substrate 24. The reaction can be to conjugate directly onto the substrate 24 or can cause a reaction to occur on compounds or layers attached to, or disposed on, the substrate 24. A decision box 82 is reached, and if the last patterning step has occurred then the process ends 84. If more patterning and catalytic steps are required, the process returns to step 74, wherein a previously design pattern from step 72 is transferred to the micromirror 16 to continue directing light catalyzed reactions on or about the substrate 24 surface.

Following are the specifications and characteristics for one embodiment of the micromirror imager system 40 of the present invention:

Control computer—PC with VGA monitor
Software—Image created using PowerPoint, custom Software or CAD software
Digital Light Processor—TI DLP with 640×480 resolution
Number of pixels—640×480=307,200
Mirror material—Aluminum
Mirror reflectivity—88%, Verified using monochromater/PM tube in our lab for visible and UV wavelengths
Mirror size—16 microns×16 microns in a 20 micron×20 micron space
Synthesis spot size—1:1 with mirror size
Mirror switching speed—2 ms
Light source—100 W mercury burner with peak at 365 nm
Light brightness—170,000 cd/cm2=250 W/(cm2*st)
Luminous Flux—2,200 lumens
Reaction chamber—custom from teflon, delrin and aluminum
Reagent delivery—syringe injectors into header
Sample configuration—coated microscope slides
Microscope slide transparency—5%@280, 40%@300, 75%@320, 87%@340, 88%@360, 89%@400, measured using spectrophotometer
Exposure time—3 minutes per coupling reaction.

The apparatus and method of the present invention has been used to: 1) show that the mirror array can project UV light (UV light cannot be passed through conventional liquid crystal displays) at sufficient intensity to conduct photochemistry, 2) demonstrate that images at the focal plane can be created, and 3) demonstrate the use of the apparatus and method photodeprotection chemistry to make an patterned substrate.

Figure 6:
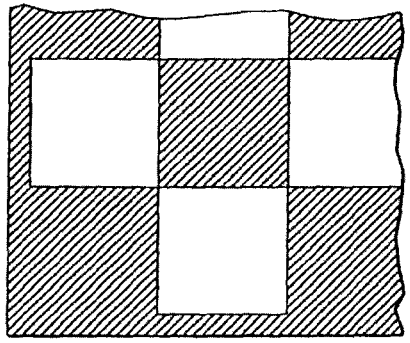
FIG. 6 is a physical mask produced using the present invention.
Figure 7:
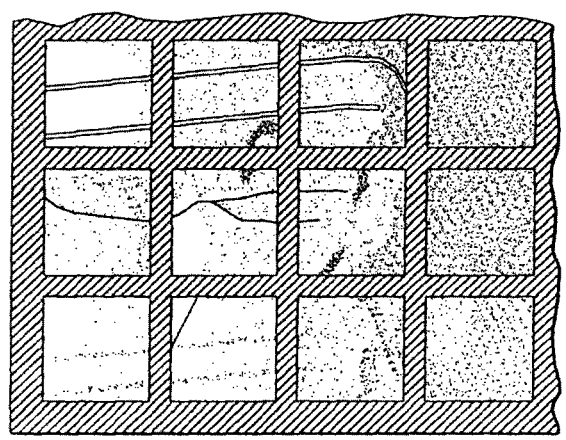
FIG. 7 is a digital image scanned of a substrate onto which a fluorochrome bound to a phosphoamidite base, which was attached using the present invention.

FIGS. 6 and 7 are drawings that represents the results from using the present invention to conduct a spatially controlled oligonucleotide synthesis using light projected with the micromirror imager system 40. FIG. 6 shows an array with a screen mask on a glass slide. The dark areas are 0.2 mm in width with a 10× magnification. The pattern was created by UV directed oligonucleotide synthesis, and was labeled using CY3 dye (Molecular Probes, Inc., U.S.A.). FIG. 6 was taken using an epi-flouresence microscope (Olympus, Inc., U.S.A). FIG. 7 shows CY3 dye conjugated oligonucleofide bases to fluoresce regions of oligonucleotide synthesis, taken using a laser scanning fluorescence system (General Scanning, Inc., U.S.A.). The micromirror was set to fully illuminate the chamber, and reaction chamber 50 was used to synthesize oligonucleotides.

Micromirror System Optics

The optics for use with the present invention can be designed to maintain the system focus while substantially increasing the contrast ratio. A high contrast ratio is critical to obtain high quality differential synthesis which is a function of UV intensity and exposure time. The critical component to obtaining higher contrast ratios is the TIR (Total Internal Reflectance) prism, depicted in FIG. 4, that escorts the UV light from the source onto the substrate and then out to the focusing optics. These optics can be customized for a particular DLP with, e.g., UV transparent glass (BK5, SF5 or K5). The use of a TIR prism is not necessary, as the apparatus and method of the present invention has been used with direct projection via a mirror set having 20 degrees off-axis of the micromirror 16 to match the cant angle of the individual mirrors and lenses. The TIR prism and lens 22, e.g., Acromat doublets or triplets, can be made from UV transparent fused silica (many types are available for 365 nm, near UV).

A high power UV source can be used, e.g., a power source of up to 1 kW can be used before reaching a damage threshold for the micromirror 16. Also, an automated liquid handling system can be constructed, fashioned from that used in the MerMade Oligo Synthesizer (UTSW Medical Center, U.S.A.) or other commercially available synthesizers (Beckman Instruments or Applied Biosciences, Inc., U.S.A.). Reagents can be kept in, e.g., Argon pressurized bottles and dispensed through teflon coated valves 44 under computer control. A National Instruments digital I/O board can be installed in the Macintosh control computer, followed by a solid state relay system that provides the level of current necessary to run the valves 44, which can be e.g., microvalves. Under computer control, the valves 44 can be opened between 100 msec and 1 sec, depending on the amount of reagent to be dispensed. The control software for the valves 44 can be Labview or other custom codes written in e.g., C or other computer languages. Pressurized bottles and valves 44 can be provided for each reagent.

The reagents will be delivered to, e.g., the slide holder 60 on which the light is projected. The slide holder 60 can be fabricated from Teflon, with slides sealed using o-rings. Two slides can be sandwiched with the reagents pumped between them. The two slide sandwich arrangement allows for the manufacture of two slides, concurrently, and minimizes the scattered light for excess light is projected through sandwich. The entire sandwich can be clamped together and Luer lock fittings will be used to attach the liquids.

The substrate, slide(s) or other surface for use with the invention may be made of different materials, such as silicon, glass or quartz. The slides may also have patterns on the surface that are useful for increasing the attachment of compounds. Additionally, the slide surface may be formed or modified to increase the surface area and consequently the amount of material that is formed, deposited or catalyzed on the slide surface. One example of a modified surface area slide for use with the invention is a microchannel slide that has a number of grooves or channels throughout the slide that increase the surface area of the slide. Another examples of a surface enhancing feature include: dimples, holes, scratches and fibrous deposits or mesh.

It should be noted, that once produced, the DOC slide arrays when used, can have a modified hybridization protocol. Possible adjustments will include temperature, time, sample concentration, buffer and wash conditions. These can be resolved depending on the background and signal to noise ratio encountered with an initial DOC slide. Once the DOC has been manufactured, however, the same slide can be stripped and reused for the next hybridization cycle with new conditions. Alternatively, the image acquisition can be recalibrated to take into account increased background signal to improve the signal to noise ratio through adjustments, manual or automatic, to the data acquisition software. In fact, sample data can be taken from the positive and negative controls on the DOC slide by, e.g., placing the positive and negative controls in the first line of samples to be scanned, and adjusting the calibration for the entire DOC chip before any more data acquisition continues.

Photoprotection Chemistries for Improved Coupling Yield

The critical step with light-directed synthesis of DNA arrays on glass supports is the rate of photolytic release of the 5'-protecting group which is related to the reaction quantum efficiency. For the 2-nitrobenzylic compounds to be used in proposed research, the 365 nm emission of the Hg lamp is almost exclusively responsible for photochemistry due to its chromophore absorbance ($\lambda_{max}$=345 nm, $\epsilon$=5×10$^3$ M$^{-1}$ cm−1). The photocleavage half-lives obey an inverse-linear dependence on light intensity and saturation of the excited state was not found over the range of 5-50 mW/cm$^2$ at 365 nm. This indicates that, in principle, even higher intensity light, such as provided by a nitrogen laser, could be used to shorten exposure times.

Solvent effects reveal that photocleavage rates proceeded rapidly under dry conditions, or when the substrate was maintained under a nonpolar solvent such as toluene or dioxane. To date, most of the photoremovable protecting groups have been derivatives of 2-nitrobenzylic compounds. Both the structure of the nitrobenzyl moiety and the atom to which it is attached have some effect on the efficiency and wavelength required for cleavage. By changing substituents in the aromatic ring and at the benzylic carbon, improved efficiency of deprotection can be accomplished. Also, different types of protecting groups that exhibit much higher photolysis rates and quantum yields can be used. One of the possible candidates can be desoxybenzoinyl (desyl) derivatives, which have much higher photolysis quantum rates and therefore can be cleaved much faster. In addition, the photo by-product is inert and photolysis is efficiently performed at 360 nm.

Fluorochromes or dyes for use with the present invention will depend on wavelength and coupling structure compatibility. By means of example, Fluorescein-5-EX, 5-SFX, Rhodamine Green-X, Bodipy FL-X, Cy2-OSu, Fluor X, 5(6) TAMRA-X, Bodipy TMR-X, Rhodamine Red-X, Texas Red-X, Bodipy TR-X, Cy3-OSu, Cy3.5-OSu, Cy5-Osu and/or Cy5.5-OSu, may be used if desired.

High density arrays of oligonucleotide (or other) probes are an emerging technology for research and potential clinical diagnostics. Arrays of up to 65,000 oligos, manufactured using conventional photolithographic methods are now available commercially from Affymetrix/Hewlett Packard. These arrays are used for resequencing and expression studies via hybridization to the array. These chips currently have feature sizes of 20 microns.

The present invention can provide a handling system for the design, deposition and formation of biological samples on slides. Furthermore, unlike biochips that are expensive to make and have a reduced yield due to the underlying electronics, the present invention does not suffer from high initial cost to set up a manufacturing run. Nor does the present invention require a long time to make a sequence change on the array. The inability to make an arbitrary sequence at an arbitrary position within the array, and low coupling efficiency have contributed to the need to search for alternatives to existing biochips.

Slide Sample Chemistry

One example of slide sample preparation for use with the micromirror imager 10 disclosed herein is the use of light catalyzed chemistry. Light catalyzed chemistry can be used to attach to, e.g., a glass slide, nucleic and amino acids, lipids, carbohydrates or inorganic or organic molecules that can be used to detect known and unknown molecules. For example, nucleic acids segments, such as oligonucleotides can be attached to detect the presence of complementary or hybridizing nucleic acids. The strength of the interaction between the nucleic acid on the slide and the analyte can be varied as is known to those of skill in the art, e.g., changes in salt concentration, temperature of hybridization, etc. Interactions with proteins and even cells can be measured by attaching, e.g., receptors or ligands to the slide surface to measure binding. As with nucleic acid interactions, interactions with receptors or ligands can be affected by the presence or absence or, e.g., cofactors, competitors and the like.

As an example, the formation of nucleic acids on the substrate surface are used as an example. More conventional chemistries may also be used to attach molecules to the substrate surface, depending on the nature of the substrate, the molecules that are being attached and other factors that will be known to those of skill in the art of chemical attachment and synthesis.

The chemistry for light-directed oligonucleotide synthesis using photo labile protected 2'-deoxynucleoside phosphorarnites has been developed at, e.g., Affymetrix, U.S.A. The basics of one type of photo-labile protection chemistry are explained in U.S. Pat. No. 5,424,186, wherein relevant explanations of basic photochemistry techniques and compounds are incorporated herein by reference.

For example, the reaction of commercially available 3,4-(methylenedioxy)acetophenone with nitric acid followed by ketone reduction, and treatment with phosgene gives chloroformate. Then 5'-hydroxyl of N-acyl-2'-deoxynucleosides reacts with chloroformate, and 3'-hydroxyl reacts with 2'-cyanoethyl N,N,N',N'-tetraisopropylphosphorodia-midite to yield photo labile protected phosphoramidites.

Standard phosphoramidite chemistry is adapted to include photo labile protecting groups by replacing the 5'-protecting group DMT, and incorporating photoactivateable hydroxyl linker into the synthesis substrate. Hydroxyl groups are selectively deprotected by irradiation at a wavelength of 365 nm, and oligonucleotides assembled using standard phosphoramidite chemistry.

Micromirror Imager for use with Expression Analysis

To study gene expression in mammalian and amphibian cells, the present invention can be used conduct studies using the genetics of yeast, as an example. With the entire sequence available for yeast, it was possible to search the Expressed Sequence Tagged subset of GenBank to identify in a quantitative way the expression levels of each yeast ORF. The available data allowed for an image to be obtained and compared to, e.g., known genes. Given genes necessary for the operation of the basic cellular machinery of yeast have overlap with other cell types, especially other eukaryotes, it is possible to inspect the data to determine candidate genes for particular disease conditions or genetic analysis.

For example, statistically relevant expression analysis can be done by sequence similarity searching of all query open reading frame or gene sequences against expressed sequence tagged cDNA sequence libraries. These libraries, because of their large size, have enabled statistically relevant comparative genomics studies of *S. cerevisiae* to EST sequences of all species represented, and with human ESTs by tissue type. All yeast ORFs (6,217) were analyzed by sequence similarity searching using sppBLASTn against the GenBank EST database (Issue 104.0, Dec. 15, 1998). This database contains 1,377,132 EST sequence files (493.6 million bp).

Polymerase Chain Reaction Polymerase Chain Reaction (PCR) products, cDNAs, oligonucleotides and DNA fragments have been spotted in excess on glass using the micromirror imager 10 of the present invention, as high-density hybridization targets. Fluorescently labeled cDNAs derived from cellular extracts of mRNA have achieved a dynamic range (detection limit) of 1 in 10,000 to 100,000, allowing for detection of message in low and high abundance. Many experiments to measure differential expression have been reported for yeast, *Arabidopsis* and human DNAs. Presently, comprehensive and concise data on quantitative analysis of gene expression are available. Use of known expression data can be used to predict and measure known expression patterns having clinical/clinical research application with unknown samples to obtain real-time expression data.

The present invention can be used with existing photochemical protocols, in conjunction with known expression levels for preselected and known genes, to optimize gene expression analysis using multiplexing of query samples by using a number of dyes and substrate produced using the micromirror imager 10. The micromirror imager 10 can be used to produce a substrate for use in identifying the expression levels of every gene of as entire organism such as yeast, at one time. For example, the micromirror imager 10 can be used for the gene networks study project of the National Institutes of Health-National Cancer Institute (NIH-NCI) by providing substrate arrays having the required diversity and sensitivity. The gene networks study involves the identification of yeast gene pathways by measuring the expression level of all 6,217 open reading frames (ORFs) in response to a systematic knockout of each gene (ORF). Using substrates produced using the micromirror imager 10 disclosed herein, the expression level of every yeast gene in every yeast gene knockout can be determined by designing and fabricating a hybridization substrate for analyzing the expression of multiple yeast gene knockouts per substrate, at a greatly reduced cost, with greater efficiency and in less time.

During expression analysis the micromirror imager 10 can be used to produce a substrate 24, such as a slide that can be used for specific hybridization of each of the ORFs in a genome. For example, a hybridization matrix can be disposed on a substrate 24, such as a glass or quartz slide. Complementary DNA can be produced from mRNA, tagged and placed on the hybridization matrix. Tagged, expressed genes are specifically hybridize with the hybridization matrix and the expressed genes are quantitated by moving the substrate 24 that has been hybridized past scanning hardware. The location and level of expression of known genes can be used as positive and negative controls to calibrate the sensitivity of the analysis.

A charge coupled display (CCD) camera connected to a microscope can be used to capture the fluorescence level on the hybridization matrix. The digital data captured by the CCD camera is sent to a computer that matches the position on the hybridization matrix of the specific gene sequence created using the micromirror imager 10. The level of fluorescence is compared to known expression level controls also on the slide, and the level of expression of each ORF is determined. Data can be displayed in real time, or can be stored for future analysis.

Software for analyzing high density grid hybridizations has been developed for use with the present invention. The software has been used to analyze over 260 images containing 1536 colonies spotted on membranes using a spotter system. The software application was developed using macros for IDL, a widely used commercial software package. IDL is a complete, integrated software environment for data analysis, visualization, and application development, made by Research Systems, Inc. (http://www.rsinc.com). Capture images are imported as either 8-bit, or 16-bit Tiff files. Key components of the analysis include spot-finding, spot-quantification, and spot addressing. The 12-bit camera output can be padded to 16-bits. The slide image can also be analyzed for constant intensity level contours satisfying the following constraints: the contour is closed (around a spot), the enclosed area is above a minimum area threshold and below a maximum area threshold, and the spot-integrated intensity is above a minimum intensity threshold relative to background. The user is presented with software controls (widget sliders) to define the parameters min_area, max_area, and min_intensity within the user interface so that the analysis is automatic and quick. The numerical parameters that set the gradation of the contours and the coarse-graining to define the local background intensity are also adjustable. Once spots are identified and quantified, the centroid of each spot is associated with a unique grid-cell that defines the spot's address in the array. This process avoids quantification errors associated with strong signals bleeding into neighboring cells. While this invention has been described in reference to illustrative embodiments, this description is not intended to be construed in a limiting sense. For example, the term "computer" as used herein is to include any control apparatus capable of actuating a micromirror or micromirror array. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. A method of patterning on a substrate comprising the steps of:
   (a) providing an apparatus consisting essentially of: an ultraviolet light source; a micromirror positioned to redirect light from the light source toward the substrate; a prism set between the micromirror and the substrate; a lens that reflects the light onto the substrate; a reaction chamber disposed about the substrate; one or more chemical lines connected to the reaction chamber; one or more chemicals connected to the chemical lines; and a computer connected to, and controlling, the micromirror and the supply of the one or more reaction chemicals to the reaction chamber via the chemical lines;
   (b) generating a light beam from the ultraviolet light source;
   (c) illuminating the micromirror with the light beam;
   (d) redirecting the light beam with the micromirror onto the substrate; and
   (e) catalyzing a light sensitive reaction at a site where light strikes the substrate within the reaction chamber using the redirected light beam in a predetermined pattern, wherein the light beam passes through the prism set after illuminating the micromirror.

2. The method of claim 1 further comprising the step of controlling the micromirror using the computer.

3. The method of claim 1 wherein the step of redirecting the light beam is accomplished using a micromirror array.

4. The method of claim 1, further comprising the steps of:
   positioning the substrate in a reaction chamber prior to catalyzing the light sensitive reaction;
   flooding the substrate with a light catalyzable reaction chemical; and
   exposing the light catalyzable reaction chemical to light using the micromirror to catalyze a chemical reaction at the site where light strikes the substrate.

5. The method of claim 1, wherein the light sensitive reaction is oligonucleotide synthesis.

6. The method of claim 1, wherein the light sensitive reaction is an amino acid addition reaction.

7. A method of patterning on a substrate within a reaction chamber comprising the steps of:
   (a) providing an apparatus consisting essentially of: an ultraviolet light source; a micromirror positioned to redirect light from the light source toward the substrate; a prism set between the micromirror and the substrate; a lens that reflects the light onto the substrate; a reaction chamber disposed about the substrate; one or more chemical lines connected to the reaction chamber; one or more chemicals connected to the chemical lines; and a computer connected to, and controlling, the micromirror and the supply of the one or more reaction chemicals to the reaction chamber via the chemical lines;

(b) generating a light beam from the ultraviolet light source;
(c) illuminating a digital light processor with the light beam;
(d) redirecting the light beam with the digital light processor onto the substrate; and
(e) catalyzing the light sensitive reaction at a site where light strikes the substrate within the reaction chamber using the redirected light beam in a predetermined pattern, wherein the light beam passes through the prism set after illuminating the digital light processor.

8. The method of claim 7, further comprising the step of controlling the digital light processor using the computer.

9. The method of claim 7, wherein the step of redirecting the light beam is accomplished using a digital light processor array.

10. The method of claim 7, further comprising the steps of:
positioning the substrate within the reaction chamber prior to catalyzing the light sensitive reaction;
flooding the substrate with a light catalyzable reaction chemical; and
exposing the light catalyzable reaction chemical to light using the digital light processor to catalyze a chemical reaction at the site where light strikes the substrate.

11. The method of claim 7, wherein the light sensitive reaction is oligonucleotide synthesis.

12. A method of patterning on a substrate comprising the steps of:
(a) providing an apparatus consisting essentially of: an ultraviolet light source; a micromirror positioned to redirect light from the light source toward the substrate; a prism set between the micromirror and the substrate; a lens that reflects the light onto the substrate; a reaction chamber disposed about the substrate; one or more chemical lines connected to the reaction chamber; one or more chemicals connected to the chemical lines; and a computer connected to, and controlling, the micromirror and the supply of the one or more reaction chemicals to the reaction chamber via the chemical lines;
(b) positioning the substrate within the reaction chamber;
(c) introducing a light catalyzable reaction chemical onto the substrate;
(d) redirecting the light beam onto the substrate with a digital light processor; and
(e) catalyzing a light sensitive reaction using the redirected light beam in a predetermined pattern, the light catalyzable reaction occurring where the light strikes the substrate, wherein the light beam passes through the prism set after illuminating the digital light processor.

13. The method of claim 12, further comprising the step of controlling the digital light processor using a computer to form the predetermined pattern.

14. The method of claim 12, wherein the step of redirecting the light beam comprises using a digital light processor array.

15. The method of claim 12, wherein the light sensitive reaction is oligonucleotide synthesis.

16. The method of claim 12, further comprising the steps of:
positioning one or more substrate within the reaction chamber;
flooding the substrate with the light catalyzable reaction chemical; and exposing the light catalyzable reaction chemical to light using one or more digital light processors to catalyze one or more chemical reactions at one or more sites where light strikes the one or more substrate.

17. An apparatus for catalyzing a reaction for oligonucleotide synthesis or for amino acid addition on a substrate consisting essentially of: an ultraviolet light source; a micromirror positioned to redirect light from the light source toward the substrate; a prism set between the micromirror and the substrate; a lens that reflects the light onto the substrate; a reaction chamber disposed about the substrate; one or more chemical lines connected to the reaction chamber; one or more chemicals connected to the chemical lines; and a computer connected to, and controlling, the micromirror and the supply of the one or more reaction chemicals to the reaction chamber via the chemical lines, wherein a light catalyzable reaction occurs at a site where light produced by the light source and redirected by the micromirror strikes the substrate.

18. The apparatus of claim 17, wherein the micromirror is further defined as a micromirror array.

19. The apparatus of claim 17, wherein the light source is a xenon lamp, or a mercury lamp, or a laser or a combination thereof.

20. The apparatus of claim 17, wherein the lens is between the micromirror and the substrate.

* * * * *